US010111361B2

(12) United States Patent
Magcale et al.

(10) Patent No.: US 10,111,361 B2
(45) Date of Patent: Oct. 23, 2018

(54) CLOSED-LOOP COOLING SYSTEM AND METHOD

(71) Applicant: Nautilus Data Technologies, Inc., San Ramon, CA (US)

(72) Inventors: Arnold C. Magcale, San Ramon, CA (US); Daniel Kekai, San Ramon, CA (US); Bryon Putnam Taylor, San Jose, CA (US)

(73) Assignee: Nautilus Data Technologies, Inc., Pleasanton, CA (US)

( * ) Notice: Subject to any disclaimer, the term of this patent is extended or adjusted under 35 U.S.C. 154(b) by 950 days.

(21) Appl. No.: 14/280,040

(22) Filed: May 16, 2014

(65) Prior Publication Data

US 2017/0202107 A1    Jul. 13, 2017

Related U.S. Application Data

(60) Provisional application No. 61/925,039, filed on Jan. 8, 2014.

(51) Int. Cl.
*H05K 7/20* (2006.01)

(52) U.S. Cl.
CPC ............... *H05K 7/20272* (2013.01)

(58) Field of Classification Search
CPC .................. H05K 7/20272; H05K 7/2079
USPC ...................... 165/104.31, 104.28
See application file for complete search history.

(56) References Cited

U.S. PATENT DOCUMENTS

| 6,212,895 | B1 | 4/2001 | Richardson |
| 6,990,395 | B2 | 1/2006 | Ransom et al. |
| 7,058,710 | B2 | 6/2006 | McCall et al. |
| 7,278,273 | B1 | 10/2007 | Whitted et al. |
| 7,525,207 | B2 | 4/2009 | Clidaras et al. |
| 7,738,251 | B2 | 6/2010 | Clidaras et al. |
| 7,864,530 | B1* | 1/2011 | Hamburgen ....... H05K 7/20827 165/104.33 |
| 8,359,191 | B2 | 1/2013 | Chen et al. |
| 8,853,872 | B2 | 10/2014 | Clidaras et al. |

(Continued)

FOREIGN PATENT DOCUMENTS

| JP | 2010269641 | 12/2010 |
| WO | 2000048288 | 8/2000 |

(Continued)

OTHER PUBLICATIONS http://www.nolimitssoftware.com/wp-content/uploads/2013/03/DCIM-Guide.pdf.

*Primary Examiner* — Raheena R Malik
(74) *Attorney, Agent, or Firm* — Patent Ventures, LLC

(57) ABSTRACT

A water based closed loop cooling system employed to cool waterborne data center facility generally comprise a plurality of filtered water intake pipes, a plurality of filtered water exhaust pipes, a plurality of heat exchangers, a plurality of closed loop cooling systems or closed loop coolant distribution units that may use freshwater as a coolant, and a plurality of piping systems. The energy efficient water based closed loop cooling system and method described may use naturally occurring cold water as a heat sink in a plurality of heat exchange systems. The systems and methods described in this document may be employed to provide an energy efficient water-based closed-loop cooling system to maintain interior ambient conditions suitable for proper operation of the plurality of computer systems therein.

15 Claims, 3 Drawing Sheets

Side View

(56) References Cited

U.S. PATENT DOCUMENTS

| | | |
|---|---|---|
| 2002/0010709 A1 | 1/2002 | Culbert et al. |
| 2006/0259201 A1 | 11/2006 | Brown |
| 2007/0213000 A1 | 9/2007 | Day |
| 2007/0281639 A1 | 12/2007 | Clidaras et al. |
| 2008/0029250 A1* | 2/2008 | Carlson ............... F24F 11/0001 165/104.33 |
| 2008/0209234 A1 | 8/2008 | Clidaras et al. |
| 2009/0037268 A1 | 2/2009 | Zaid et al. |
| 2009/0083126 A1 | 3/2009 | Koren et al. |
| 2009/0084297 A1 | 4/2009 | Choi et al. |
| 2009/0126909 A1* | 5/2009 | Ellsworth, Jr. ...... H05K 7/2079 165/104.33 |
| 2009/0126910 A1 | 5/2009 | Campbell et al. |
| 2009/0171512 A1* | 7/2009 | Duncan ................ F24F 5/0035 700/300 |
| 2009/0201645 A1* | 8/2009 | Kashirajima ........... F25B 25/00 361/700 |
| 2009/0207567 A1 | 8/2009 | Campbell et al. |
| 2009/0241578 A1* | 10/2009 | Carlson ................. F25D 17/06 62/259.2 |
| 2009/0295167 A1 | 12/2009 | Clidaras et al. |
| 2009/0299824 A1 | 12/2009 | Barnes |
| 2010/0030552 A1 | 2/2010 | Chen et al. |
| 2010/0298997 A1 | 11/2010 | Ohba et al. |
| 2010/0300650 A1* | 12/2010 | Bean, Jr. ............ H05K 7/20345 165/67 |
| 2011/0056674 A1* | 3/2011 | Campbell ............ H05K 7/2079 165/247 |
| 2011/0060470 A1 | 3/2011 | Campbell et al. |
| 2011/0072293 A1 | 3/2011 | Mazzaferri et al. |
| 2011/0207391 A1 | 8/2011 | Hamburgen et al. |
| 2011/0239671 A1* | 10/2011 | Malone ................ H05K 7/2079 62/178 |
| 2012/0042263 A1 | 2/2012 | Rapaport et al. |
| 2012/0136998 A1 | 5/2012 | Hough et al. |
| 2012/0166433 A1 | 6/2012 | Tseng |
| 2012/0166616 A1 | 6/2012 | Meehan et al. |
| 2013/0238795 A1 | 9/2013 | Geffin et al. |
| 2014/0259618 A1 | 9/2014 | Rikoski et al. |

FOREIGN PATENT DOCUMENTS

| | | |
|---|---|---|
| WO | 2009055368 | 4/2009 |
| WO | 2010129341 | 11/2010 |
| WO | 2012047746 | 4/2012 |
| WO | 2013113138 | 8/2013 |

* cited by examiner

Side View

System Flow View

CLOSED-LOOP COOLING SYSTEM AND METHOD

CROSS REFERENCE TO RELATED APPLICATIONS

This application claims reference to Provisional Patent application No. 61/925,039 filed on Jan. 8, 2014, entitled "A water-based closed-loop cooling system used to cool a waterborne data center facility".

FIELD

The present invention relates to cooling facilities for waterborne data centers.

BACKGROUND OF THE INVENTION

Data centers and co-location providers in particular struggle with both supplying requisite power as well as cooling. As data center density continues to increase there is a growing demand for more energy efficient and cost effective data centers and co-location solutions.

A data center is designed to maintain interior ambient conditions suitable for proper operation of the computer systems therein. Typical data centers may consume more than twice the power needed to support the plurality of computer systems housed therein. This is a result of the inefficient air conditioning units that may account for half of the total power consumed in the data center to cool the plurality of computer systems therein. This inefficiency prohibits support of high density computing systems in today's data centers.

Embodiments disclosed include a closed-looped, energy efficient, cost effective thermal management system that leverages natural surrounding resources, namely water, to control thermal conditions and reduce the overall requirement for cooling power in waterborne data centers.

A data center is a facility designed to house, maintain, and power a plurality of computer systems. The computer systems within the data center are generally rack mounted within a support frame referred to as a rack. The data center is defined to maintain interior ambient conditions suitable for proper operation of the computer systems therein.

A key constraint of the data center is cooling capacity. Each watt consumed by the computer systems is a watt of waste heat that must be removed to maintain suitable operating temperature. Conventional data centers employ air conditioning units to maintain suitable operating temperatures. The air conditioning units are inefficient and account for more than half of the total power consumed in the data center.

As power density in data centers continues to increase, data center providers struggle with cooling demands that can quickly out strip the data center capabilities. Conventional data centers employ traditional air conditioning units to maintain suitable operating temperatures for the plurality of computer systems therein. These air conditioning units are inefficient and may account for half of the power consumed in the data center facility. This inefficiency prohibits support of high-density computer systems in data centers.

The methods and systems for a water based closed-loop cooling system described, using naturally cold water as a heat sink in a plurality of heat exchange systems, consume substantially less power to maintain interior ambient conditions suitable for proper operation of the computer systems therein when compared to traditional air conditioning units.

SUMMARY

A water-based closed-loop cooling system comprising a single or plurality of filtered water intake pipes and corresponding water exhaust pipes; a single or plurality of water pumps; a single or plurality of heat exchangers; a single or plurality of coolant heat exchange pipes; and a closed-loop coolant distribution unit; wherein the single or plurality of water pumps are caused to pump water in through the water intake pipes and out through the water exhaust pipes; the flow based intake/discharge system depends on the direction of the water flow; and wherein the coolant distribution unit is caused to circulate stored coolant through the coolant heat exchange pipes.

In a water-based closed-loop cooling system, a method comprising pumping water in through a single or plurality of filtered water intake pipes and out through corresponding water exhaust pipes; circulating via the single or plurality of water intake pipes and corresponding water exhaust pipes, the pumped water through one side of a single or plurality of heat exchangers; circulating through another side of the single or plurality of heat exchangers, a coolant, comprised in a coolant distribution unit, via a single or plurality of coolant heat exchange pipes.

A closed loop cooling system wherein the closed loop cooling system is caused to circulate cold water through one side of a single or plurality of heat exchangers; circulate a coolant in a closed loop through another side of the single or plurality of heat exchangers; such that the circulated cold water is caused to absorb heat from the circulated coolant through the single or plurality of heat exchangers through which it is caused to circulate; and wherein the closed loop cooling system is further caused to circulate the coolant through a heat generating source before circulating the coolant through the single or plurality of heat exchangers.

DETAILED DESCRIPTION OF THE INVENTION

As stated above, a data center is a facility designed to house, maintain, and power a plurality of computer systems. The computer systems within the data center are generally rack-mounted within a support frame referred to as a rack. The data center is defined to maintain interior ambient conditions suitable for proper operation of the computer systems therein.

A key constraint of the data center is cooling capacity. Each watt consumed by the computer systems is a watt of waste heat that must be removed to maintain suitable operating temperature. Conventional data centers employ air conditioning units to maintain suitable operating temperatures. The air conditioning units are inefficient and account for more than half of the total power consumed in the data center.

As power density in data centers continues to increase, data center providers struggle with cooling demands that can quickly outstrip the data center capabilities. The invention claimed here solves this problem.

Embodiments disclosed include water-based closed-loop cooling systems and methods using naturally cold water as a heat sink in a heat exchange system used to absorb heat generated by a plurality of computing systems housed in a data center facility. Such embodiments drastically reduce power consumption in data center facilities. The described methods and systems implement a water-based closed-loop cooling system and method that consumes substantially less power to maintain suitable operating temperatures in the data center facility when compared to traditional air conditioning units. This energy efficiency enables support of very high-density computing systems in the data center facility.

A data center is designed to maintain interior ambient conditions suitable for proper operation of the computer systems therein. Conventional data centers may consume more than twice the power needed to support the plurality of computer systems housed therein. This is a result of the inefficient air conditioning units that may account for half of the total power consumed in the data center to cool the plurality of computer systems therein. This inefficiency prohibits support of high density computing systems in conventional data centers.

The methods and systems for a water based closed-loop cooling system described, using naturally cold water as a heat sink in a plurality of heat exchange systems, will consume substantially less power to maintain interior ambient conditions suitable for proper operation of the computer systems therein when compared to traditional air conditioning units.

Figure 1:
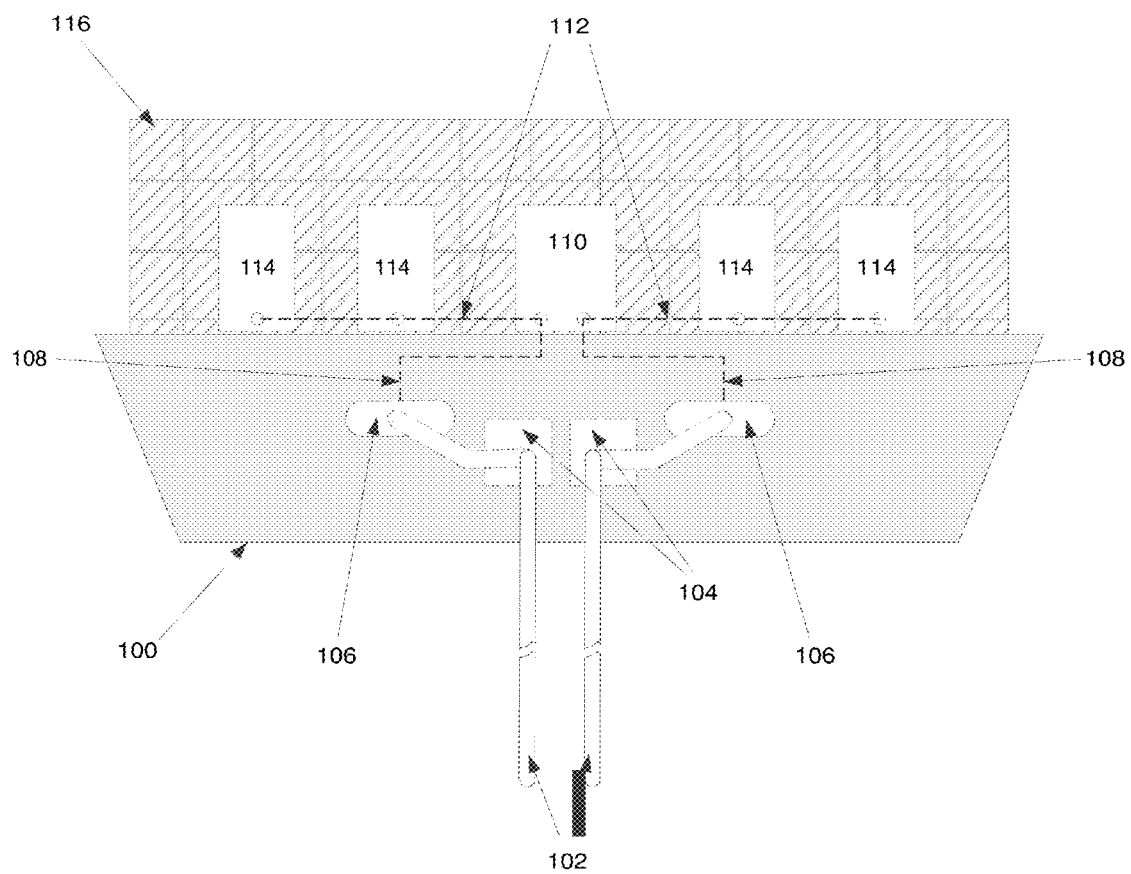
FIG. 1 illustrates a side view of an embodiment of the water-based closed-loop cooling system implemented on a waterborne data center.

FIG. 1 illustrates a side view of an embodiment of the water-based closed-loop cooling system implemented on waterborne data center. According to an embodiment, the closed loop cooling system is comprised in a waterborne data center vessel 100, and further comprises filtered water intake pipes 102, water pump/s 104, heat exchangers 106, coolant heat exchange piping 108, closed-loop coolant distribution unit 110, coolant distribution piping 112, data center module 114, and data center facility 116.

Figure 2:
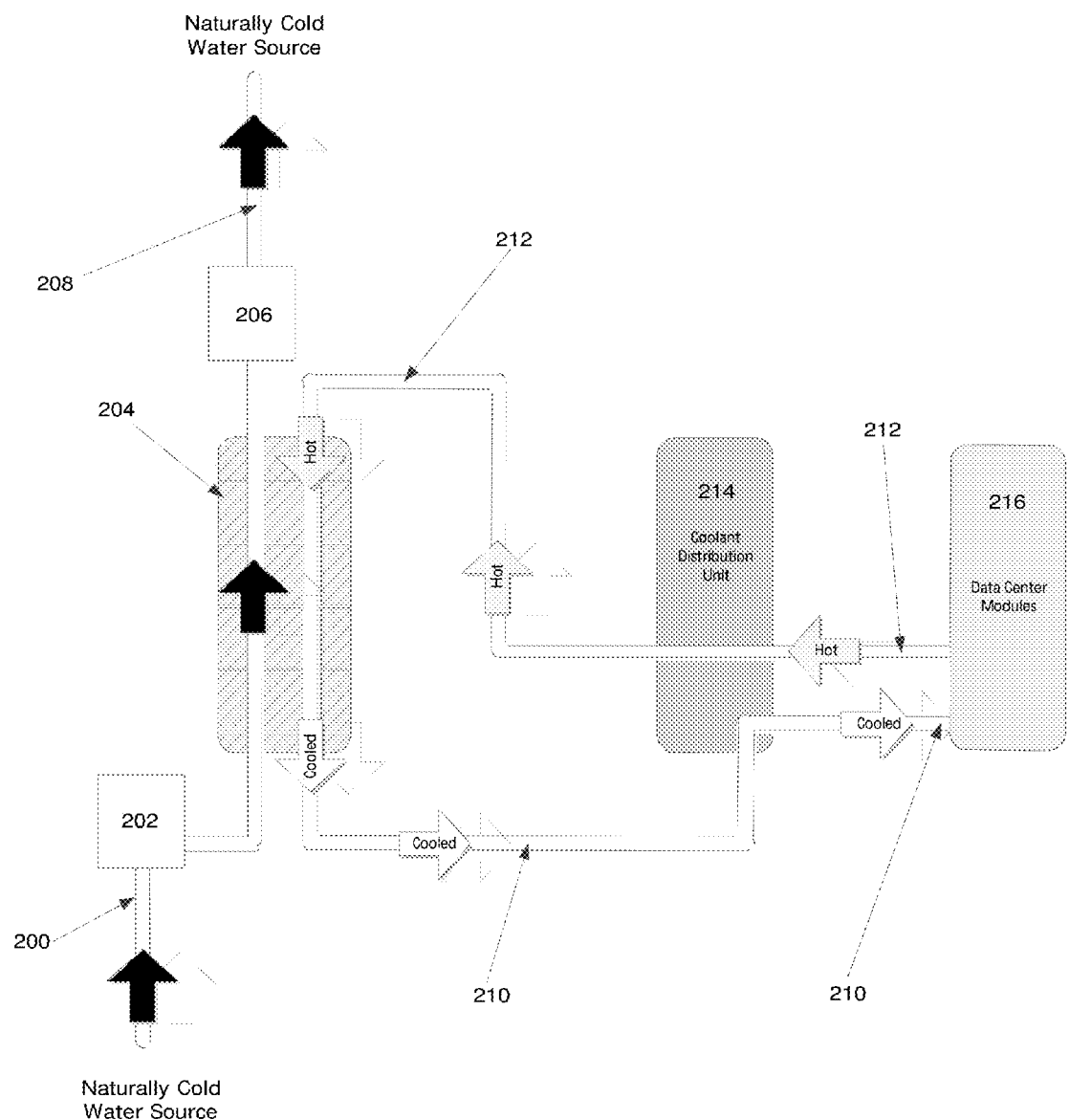
FIG. 2 illustrates the system water flow view.

FIG. 2 illustrates the system water flow view. The embodiment illustrated includes filtered water intake pipes 200, water pump 202, heat exchangers 204, water pump 206, filtered water exhaust pipes 208, cooled coolant piping 210, closed-loop coolant distribution unit 214, and data center module 216.

Figure 3:
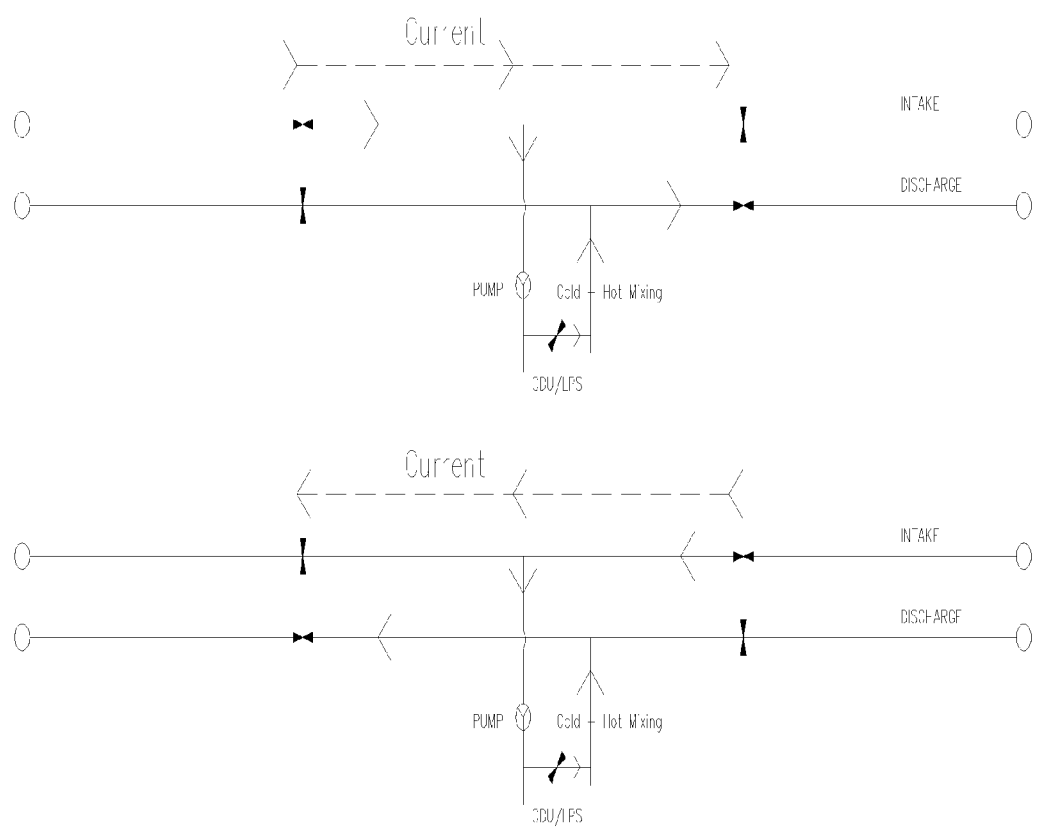
FIG. 3 illustrates a flow based intake and discharge system.

Embodiments of the water-based closed-loop cooling system are shown in FIG. 1 (side view), FIG. 2 (system flow view), and FIG. 3 (flow based intake/discharge system). FIG. 1 shows a side view of the water-based closed-loop cooling system implemented on a waterborne data center vessel 100. The water-based closed-loop cooling system may comprise filtered water intake pipes 102, water pumps 104, heat exchangers 106, coolant heat exchange piping 108, closed-loop coolant distribution unit 110 that may use fresh water as a coolant and coolant distribution piping 112. The data center facility 116 may contain a plurality computer systems installed in a plurality of data center modules 114. Data center modules are structures similar in shape and size to shipping containers. The data center modules in general comprise a plurality of racks, a plurality of rack-mounted computer systems and water-based cooling units. In another embodiment, the filtered water intake pipes 102 and filtered water exhaust pipes may be installed in the bow (front) or stern (back) section of the water borne data center vessel instead of on the starboard (right) or port (left) sides of the vessel.

FIG. 2 is a system flow view of the water-based closed-loop cooling system. The water based closed-loop cooling system may comprise a plurality of filtered water intake pipes 200, a plurality of water pumps (202,206), a plurality of heat exchangers 204, a plurality of filtered water exhaust pipes 208, cold coolant piping 210, hot coolant piping 212 and closed-loop cooling distribution unit 214 that may use fresh water as a coolant. The closed-loop cooling distribution units 214 may be connected to the heat exchangers 204 and to the data center modules 216.

The water-based closed-loop cooling system in general will be implemented on a water borne data center vessel 100 that may house a plurality of computing systems installed in data center modules 114. The water-based closed-loop cooling system may comprise a plurality of filtered water intake pipes 102, a plurality of water pumps 104, a plurality of heat exchangers 106, hot coolant piping 212, cold coolant piping 210, a plurality of filtered water exhaust pipes 208 and a plurality of closed-loop cooling distribution units 214 that may use fresh water as a coolant.

The heat generated by the computing systems in the data center modules 216 is absorbed by the energy-efficient water-based closed-loop cooling system. Naturally cold water may be drawn through filtered water intake pipes 200 by water pumps 202. The naturally cold water may then be pumped through one side of the heat exchangers 204 where it serves as a heat sink to cool the hot coolant from the coolant distribution unit 214 being pumped through the other side of the heat exchangers 104. The naturally cold water after absorbing the heat from the hot coolant may then be pumped from the water borne data center facility by pumps 206 and expelled through filtered water exhaust pipes 208 where it returns to the naturally cold water source. The closed-loop cooling distribution unit 214 may use fresh water as a coolant. The closed-loop cooling system may pump the cooled coolant to the data center modules 116 cooling units (not pictured) where it absorbs heat generated by the plurality of computing systems therein. The heated coolant returned from the data center modules 216 cooling units (not pictured) may then be pumped through one side of the heat exchangers 204 while naturally cold water is being pumped through the other side of the heat exchanger 204 absorbing the heat from the hot coolant.

FIG. 3 illustrates an intake and discharge system that changes with a computer controlled flow valve as the water current changes direction.

An embodiment includes a water-based closed-loop cooling system comprising a single or plurality of filtered water intake pipes and corresponding water exhaust pipes, a single or plurality of water pumps, a single or plurality of heat exchangers, a single or plurality of coolant heat exchange pipes, and a closed-loop coolant distribution unit; wherein the single or plurality of water pumps are caused to pump water in through the water intake pipes and out through the water exhaust pipes, and wherein the coolant distribution unit is caused to circulate stored coolant through the coolant heat exchange pipes. The stored coolant circulated through the close loop coolant heat exchange pipes is caused to absorb heat from a heat generating source, and via the single or plurality of heat exchangers, transfer the absorbed heat to the pumped water flowing through the single or plurality of filtered water intake pipes. According to an embodiment, the heat generating source is a computer data center. However the closed loop cooling system may be deployed to cool any heat generating source, such as residential or commercial buildings or complexes, auditoriums, factories, facilities, etc. as would be apparent to a person having ordinary skill in the art. Preferably, the filtered water intake pipes further comprise means for pumping water from a nearby source in close proximity. Embodiments disclosed exploit ambient environmental conditions/resources, and concentrate the exploited conditions for cooling purposes. The nearby source is at least one of an ocean or sea, a river, a lake, a reservoir, a glacier, an aquifer, reclaimed water, non-potable water and a mountain spring. The direction of the water intake and discharge can change directions through a computer controlled flow valve that is part of the flow based intake and discharge system. Additionally and alternatively, the closed loop coolant distribution unit further comprises means for using surrounding water in close proximity, as a coolant.

An embodiment includes a closed loop cooling system wherein the closed loop cooling system is caused to: circulate cold water through one side of a single or plurality of heat exchangers, circulate a coolant in a closed loop through another side of the single or plurality of heat exchangers, such that the circulated cold water is caused to absorb heat from the circulated coolant through the single or plurality of heat exchangers through which it is caused to circulate; and wherein the closed loop cooling system is further caused to circulate the coolant through a heat generating source before circulating the coolant through the single or plurality of heat exchangers. According to an embodiment the heat generating source is a computer data center. However the closed loop cooling system may be deployed to cool any heat generating source, such as residential or commercial buildings or complexes, auditoriums, factories, facilities, etc. as would be apparent to a person having ordinary skill in the art.

According to an embodiment, the system further comprises a single or plurality of filtered water intake pipes for transporting water from a nearby source in close proximity. Preferably, the system comprises a single or plurality of water pumps for pumping water through the said single or plurality of filtered water intake pipes from the nearby source in close proximity. Further, the closed loop cooling system comprises a single or plurality of filtered water exhaust pipes for transporting the said circulated cold water, caused to absorb heat from the said circulated coolant through the single or plurality of heat exchangers, away from the heat generating source, namely, the data center facility. The nearby water source is at least one of an ocean or sea, a river, a lake, a reservoir, a glacier, and a mountain spring, wherein the closed loop coolant distribution comprises means for using the surrounding water in close proximity, as a coolant.

An embodiment includes, in a water-based closed-loop cooling system, a method comprising, pumping water in through a single or plurality of filtered water intake pipes and out through corresponding water exhaust pipes, circulating via the single or plurality of water intake pipes and corresponding water exhaust pipes, the pumped water through one side of a single or plurality of heat exchangers, circulating through another side of the single or plurality of heat exchangers, a coolant, comprised in a coolant distribution unit, via a single or plurality of coolant heat exchange pipes. The stored coolant circulated through the close loop coolant heat exchange pipes is caused to absorb heat from a heat generating source, and via the single or plurality of heat exchangers, transfer the absorbed heat to the pumped water flowing through the single or plurality of filtered water intake pipes. According to an embodiment, the heat generating source is a computer data center. However the closed loop cooling system may be deployed to cool any heat generating source, such as residential or commercial buildings or complexes, auditoriums, factories, facilities, etc. as would be apparent to a person having ordinary skill in the art. Preferably, the filtered water intake pipes further comprise means for pumping water from a nearby source in close proximity. The nearby source is at least one of an ocean or sea, a river, a lake, a reservoir, a glacier, and a mountain spring, and the method disclosed comprises means for using the surrounding water in close proximity, as a coolant.

In a preferred embodiment, the water-based closed-loop cooling system is capable of maintaining interior ambient conditions that are suitable for normal operating conditions for computing systems housed in a data center. All water pumps, piping, heat exchangers and closed-loop distribution units are designed proportionately, with sufficient capabilities to support the desired amount of heat rejection.

Additionally, according to an embodiment, a water based closed loop cooling system installed on a water borne data center vessel comprises completely fabricated and constructed (naturally) cold water piping and pump elements, heat exchangers and closed-loop distribution units capable of using fresh water as a coolant, and hot and cold coolant distribution piping.

All of the elements above are necessary in an ideal embodiment.

In an alternate embodiment a refrigerant may be used as a coolant rather than fresh water by the closed-loop cooling system.

In yet another embodiment, the filtered water intake pipes and filtered water exhaust pipes may be installed in the bow (front) or stern (back) section of the water borne data center vessel instead of on the starboard (right) or port (left) sides of the vessel.

In yet another embodiment the heat exchangers, water pumps and all hot and cold coolant piping may be installed above deck instead of below deck as described in this document.

In yet another embodiment a tank may be employed to store cold fresh water. In this embodiment the tank would be connected to the closed-loop distribution units and the heat exchange systems. The water-based closed-loop cooling system and method described may be employed to replace traditional air conditioning systems and methods in building structures. The described system and methods may be used to cool hospital buildings, office buildings, stadiums, dwellings, land based data centers or any such building structures.

A water distribution piping system may be used to access a body of naturally cold water. A water pump station may be employed to pump the naturally cold water through the distribution piping to areas where building structures are located. Within the building structure a pump system would draw the naturally cold water in to the structure where it would then be moved through a heat exchange system and then pumped back to the naturally cold water source. This embodiment would greatly reduce the power consumed to cool ambient temperatures to suitable conditions in a variety of building structures.

How to Use the Invention:

Embodiments disclosed include systems and methods to resolve energy-efficiency issues especially with regards to cooling of ambient temperatures in hospitals, business buildings, dwellings, stadiums, land based data centers, water borne data centers, and other similar structures.

Embodiments of the disclosed system and method may also be adapted to cool ambient temperatures in cruise ships, house boats, building structures on barges or other similar marine vessels or building structures on marine vessels, as would be apparent to a person having ordinary skill in the art.

Additionally, embodiments of the described invention may be used to cool ambient temperatures in a variety of structures, including but not limited to buildings, hospitals, data centers, stadiums, multitenant dwellings and single family dwellings, in an energy-efficient and cost-effective manner.

According to an embodiment, the closed loop cooling system comprises a configurable modular unit. The modular units may be configured to cool a data center modular container or a plurality of data center modular containers. Each unit may be enclosed in an ISO or NON-ISO container and may comprise a plurality of pumps, heat exchangers and flow valves. The modular unit may be configured to be installed in close proximity to a data center modular container or a plurality of data center modular containers and utilized to cool the IT equipment therein.

According to an embodiment, the configurable modular unit may be configured to cool a variety of facilities and may comprise a plurality of pumps, heat exchangers and flow valves. Each unit may be enclosed in an ISO or NON-ISO container to ease deployments. The modular units may be configured to be quickly installed in a variety of facilities and used to cool the ambient temperatures therein.

According to an embodiment, the closed loop cooling system is water based, and designed to cool a data center housed on a marine vessel wherein the data center may be submerged under water, or alternatively, not submerged but floating above the surface. The water based cooling system is installed and optimized to leverage natural surrounding environmental resources, and to channel ambient environmental conditions for cooling purposes.

Additionally, heat from the exhaust or hot water return from the water based cooling system could also be used as a renewable energy source or used as part of a waste heat system.

The water based closed-loop cooling system is highly reconfigurable, and can be adapted for use in office buildings, residential homes, schools, government buildings, cruise ships, naval vessels, mobile homes, temporary worksites, remote work sites, hospitals, apartment buildings, etc. Other variations, modifications, and applications are possible, as would be apparent to a person having ordinary skill in the art.

Additionally, partial or complete embodiments of the disclosed invention can be utilized in alternate applications without departing from the scope and spirit of the disclosure. For example, water based closed loop cooling systems that leverage natural resources within close proximity can be utilized to cool virtually anything, including but not limited to buildings or dwellings, in an energy—efficient and cost—effective manner.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of waterborne vessels, computer data centers and closed and open loop cooling systems, that although the preferred and alternate embodiments have been shown and described in accordance with the Patent Statutes, the invention is not limited thereto or thereby.

The figures illustrate the architecture, functionality, and operation of possible implementations of systems and methods according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In general, the steps executed to implement the embodiments of the invention, may be part of an automated or manual embodiment, and programmable to follow a sequence of desirable instructions.

The present invention and some of its advantages have been described in detail for some embodiments. It should be understood that although the closed loop cooling system and process is described with reference to a water borne data center, the system and process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A re-configurable cooling system comprising:
 a configurable modular unit, which further comprises:
 a flow based intake and discharge system further comprising a single or plurality of computer controlled flow valves wherein the computer controlled flow valves enable the intake and discharge system to interchange based upon the direction of a water current;
 a single or plurality of filtered water intake pipes and corresponding filtered water exhaust pipes each of which further comprise the single or plurality of computer controlled flow valves;
 a single or plurality of water pumps operatively coupled to each of the single or plurality of filtered water intake pipes;

a single or plurality of heat exchangers each of which is operatively coupled to the single or plurality of filtered water intake pipes and to a single or plurality of coolant heat exchange pipes; and a closed-loop coolant distribution unit operatively coupled to the single or plurality of coolant heat exchange pipes;

a tank, connected to the closed-loop distribution unit, and the single or plurality of heat exchangers;

wherein the single or plurality of water pumps are caused to pump water in through the water intake pipes, and out through the water exhaust pipes;

wherein the coolant distribution unit is caused to circulate stored coolant through the coolant heat exchange pipes; and wherein the stored coolant is at least one of a refrigerant and freshwater.

2. The system of claim 1 wherein the stored coolant circulated through the closed loop coolant heat exchange pipes is caused to absorb heat from a heat generating source, and via the single or plurality of heat exchangers, transfer the absorbed heat to the pumped water flowing through the single or plurality of filtered water intake pipes.

3. The system of claim 2 wherein the heat generating source is a computer data center.

4. The system of claim 1 wherein the single or plurality of water pumps are used for pumping water from a source through the filtered water intake pipes.

5. The system of claim 4 wherein the pumping water through the filtered water intake pipes comprises pumping water from the source comprising at least one of an ocean or sea, a river, a lake, a reservoir, a glacier, an aquifer, reclaimed water, non-potable water and a mountain spring.

6. In a re-configurable cooling system comprising a configurable modular unit, a method comprising:

pumping water in through a single or plurality of filtered water intake pipes and out through corresponding filtered water exhaust pipes;

wherein the filtered water intake and corresponding exhaust pipes are comprised in an intake and discharge system and further comprise a single or plurality of corresponding computer controlled flow valves wherein the computer controlled flow valves enable the intake and discharge system to interchange based upon the direction of a water current;

circulating via the single or plurality of filtered water intake pipes and corresponding filtered water exhaust pipes, the pumped water through one side of a single or plurality of heat exchangers each of which is operatively coupled to the single or plurality of filtered water intake pipes and corresponding filtered water exhaust pipes, via the single or plurality of computer controlled flow valves;

circulating through another side of the single or plurality of heat exchangers, a coolant, comprised in a closed-loop coolant distribution unit, via a single or plurality of coolant heat exchange pipes operatively coupled to each of the single or plurality of heat exchangers; and wherein circulating the coolant comprises circulating via a tank connected to the closed-loop coolant distribution unit and the single or plurality of heat exchangers.

7. The method of claim 6 wherein the stored coolant circulated through the coolant heat exchange pipes is caused to absorb heat from a heat generating source, and via the single or plurality of heat exchangers, transfer the absorbed heat to the pumped water flowing through the single or plurality of filtered water intake pipes.

8. The method of claim 7 wherein the heat generating source is a computer data center.

9. The method of claim 6 wherein the pumping water comprises pumping water from a source wherein the source comprises at least one of an ocean or sea, a river, a lake, a reservoir, a glacier, an aquifer, reclaimed water, non-potable water and a mountain spring.

10. A re-configurable cooling system comprising a configurable modular unit wherein the cooling system is caused to:

circulate cold water via a flow intake and discharge system comprising a single or plurality of computer controlled flow valves through one side of a single or plurality of heat exchangers;

wherein the single or plurality of flow valves cause the intake and discharge system to interchange based upon the direction of a water current;

circulate a coolant in a closed loop from a closed loop distribution unit through another side of the single or plurality of heat exchangers, such that;

the circulated cold water is caused to absorb heat from the circulated coolant through the single or plurality of heat exchangers through which it is caused to circulate;

wherein the closed loop distribution unit is further caused to circulate the coolant through a heat generating source before circulating the coolant through the single or plurality of heat exchangers, wherein the single or plurality of heat exchangers are detached from the heat generating source;

wherein the closed loop distribution unit and the single or plurality of heat exchangers are connected to a tank containing the circulated coolant; and wherein the coolant is at least one of a refrigerant and freshwater.

11. The reconfigurable cooling system of claim 10 wherein the heat generating source is a computer data center.

12. The reconfigurable cooling system of claim 10 wherein the single or plurality of computer controlled flow valves are further comprised in a single or plurality of filtered water intake pipes for transporting water from a source.

13. The reconfigurable cooling system of claim 12 wherein the system further comprises a single or plurality of water pumps for pumping water through the said single or plurality of filtered water intake pipes from the source.

14. The reconfigurable cooling system of claim 10 wherein the single or plurality of computer controlled flow valves are further comprised in a single or plurality of filtered water exhaust pipes for transporting the said circulated cold water, caused to absorb heat from the said circulated coolant through the single or plurality of heat exchangers, away from the heat generating source.

15. The reconfigurable cooling system of claim 12 wherein the source is at least one of an ocean or sea, a river, a lake, a reservoir, a glacier, and a mountain spring.

* * * * *